US006996453B2

(12) United States Patent
Ahn et al.

(10) Patent No.: US 6,996,453 B2
(45) Date of Patent: Feb. 7, 2006

(54) SUBSTRATE PROCESSING APPARATUS AND METHOD OF PROCESSING SUBSTRATE WHILE CONTROLLING FOR CONTAMINATION IN SUBSTRATE TRANSFER MODULE

(75) Inventors: Yo-Han Ahn, Suwon (KR); Ki-Doo Kim, Suwon (KR); Soo-Woong Lee, Seoul (KR); Jung-Sung Hwang, Suwon (KR); Hyeog-Ki Kim, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 10/684,436

(22) Filed: Oct. 15, 2003

(65) Prior Publication Data

US 2004/0105738 A1    Jun. 3, 2004

(30) Foreign Application Priority Data

Nov. 29, 2002    (KR)   ...................... 10-2002-0075458

(51) Int. Cl.
*G06F 7/00*    (2006.01)
(52) U.S. Cl. ...................... 700/213; 414/217; 414/805; 414/939; 454/229
(58) Field of Classification Search ................ 700/213; 414/217, 217.1, 820, 805, 806, 935, 937, 414/939; 454/228, 229, 231, 258, 187
See application file for complete search history.

(56) References Cited

U.S. PATENT DOCUMENTS

| | | | | |
|---|---|---|---|---|
| 4,923,352 A | * | 5/1990 | Tamura et al. ......... | 414/225.01 |
| 5,303,482 A | * | 4/1994 | Yamashita et al. ............ | 34/80 |
| 5,378,283 A | * | 1/1995 | Ushikawa .................... | 118/719 |
| 5,474,410 A | * | 12/1995 | Ozawa et al. ............... | 414/217 |
| 5,536,320 A | * | 7/1996 | Ushikawa et al. .......... | 118/719 |
| 5,740,034 A | * | 4/1998 | Saeki .......................... | 700/59 |
| 5,829,939 A | * | 11/1998 | Iwai et al. ................... | 414/411 |
| 5,876,280 A | * | 3/1999 | Kitano et al. ............... | 454/187 |
| 5,997,398 A | * | 12/1999 | Yamada et al. ............. | 454/187 |

(Continued)

FOREIGN PATENT DOCUMENTS

EP          0 768 525 A2      4/1997

OTHER PUBLICATIONS

Benevenga, Norlin J., "Toxicities of Methionine and Other Amino Acids", *Journal of Agricultural and Food Chemistry*, Jan.-Feb. 1974, pp. 2-9, vol. 22, No. 1, American Chemical Society, Easton, Pennsylvania.

(Continued)

*Primary Examiner*—Khoi H. Tran
(74) *Attorney, Agent, or Firm*—Volentine Francos & Whitt PLLC

(57) ABSTRACT

A substrate processing apparatus for processing substrates prevents the substrates from contaminating as they are transferred. The apparatus includes a container, like a FOUP, for containing substrates, at least one processing chamber where the substrates are processed, a substrate transferring module including a substrate transfer chamber and at least one load port for supporting a container, and a contamination controlling system for the substrate transfer chamber. The contamination controlling system includes a purge gas supply inlet connected to the substrate transfer chamber, and a gas circulating tube for recycling the purging gas to circulate through the chamber. The substrate transfer chamber is purged using the purging gas to remove moisture and contaminating materials from the substrate transfer chamber. The formation of particles on the substrate otherwise caused by a reaction between the moisture and contaminating materials while the substrate is standing by in the container can be prevented.

6 Claims, 8 Drawing Sheets

U.S. PATENT DOCUMENTS

| | | | |
|---|---|---|---|
| 6,224,679 B1 | 5/2001 | Sasaki et al. | |
| 6,477,440 B1 * | 11/2002 | Davis | 700/123 |
| 6,802,934 B2 * | 10/2004 | Saeki et al. | 156/345.31 |
| 2002/0142496 A1 | 10/2002 | Nakasuji et al. | |

OTHER PUBLICATIONS

Blom, Henk J. et al., "Transamination of methionine in humans", Clinical Science, 1989, pp. 43-49, vol. 76, Medical Research Society, London.

Campbell, Kathleen C.M. et al., "D-Methionine protects against cisplatin damage to the stria vascularis", Hearing Research, 1999, pp. 13-28, vol. 138, Elsevier Science, Amsterdam.

Campbell, Kathleen C.M. et al., "D-Methionine provides excellent protection from cisplatin ototoxicity in the rat", Hearing Research, Dec. 1996, pp. 90-98, vol. 102, No. ½, Elseview Science, Amsterdam.

Donnelly, J.P. et al., "Can anything be done about oral mucositis?", Annals of Oncology, 2003, pp. 505-507, vol. 14, European Society for Medical Oncology.

Friedman, Mendel, "Chemistry, Nutrition, and Microbiology of D-Amino Acids", Journal of Agricultural and Food Chemistry, Sep. 1999, pp. 3457-3479, vol. 47, No. 9, The American Chemical Society, Easton, Pennsylvania.

Ghibelli, L. et al., "Rescue of cells from apoptosis by inhibition of active GSH extrusion", Faseb Journal, Apr. 1998, pp. 479-486, Abstracts Part II, vol. 12, No. 5, Federation of American Societies for Experimental Biology, Bethesda, Maryland.

Kaji, Hiroshi et al., "Urinary 3-Methylthiopropionate Excretion and the Effect of D- or L-Methionine Ingestion Studied in Healthy Subjects", Chemical Pathology and Pharmacology, Apr. 1987, pp. 101-109, vol. 56, No. 1, P.J.D. Publications, Westbury, New York.

Kies, Constance et al., "Comparative Value of L-, DL-, and D-Methionine Supplementation of an Oat-based Diet for Humans", The Journal of Nutrition, Jul. 1975, pp. 809-814, vol. 105, No. 7, The American Institute of Nutrition, Bethesda, Maryland.

Lu, S., "Regulation of Hepatic Glutathione Synthesis", Seminars in Liver Disease, 1998, pp. 331-334, vol. 18, No. 4, Thieme Medical Publishers, Inc., New York.

National Research Council., Recommended Dietary Allowances, 1980, Ninth Edition, Washington D.C.

Reser, David et al., "L- and D-Methionine Provide Equivalent Long Term Protection Against CDDP-Induced Ototoxicity In Vivo, with Patrial In Vitro and In Vivo Retention of Antineoplastic Activity", Neuro Toxicology, Oct. 1999, pp. 731-748, vol. 20, No. 5, Intox Press, Inc., Redfield, Arkansas.

Sonis, S.T., "Mucositis as a biological process: a new hypothesis for the development of chemotherapy-induced stomatotoxicity", Oral Oncology, Jan. 1998, pp. 39-43, vol. 34, No. 1, Pergamon.

Sonis, Stephen T. et al., "Editorial—Prevention of mucositis in cancer patients", Journal of the National Cancer Institute—Mucosal Injury in Cancer Patients: New Strategies for Research and Treatment, 2001, pp. 1-2, No. 29, U.S. Dept. of Health and Human Services, Washington D.C.

Stegink, Lewis D. et al., "Effects of Equimolar Doses of L-Methionine, D-Methionine and L-Methionine-dl-Sulfoxide on Plasma and Urinary Amino Acid Levels in Normal Adult Humans", The Journal of Nutrition, Jul. 1986, pp. 1185-1192, vol. 116, No. 7, The Wistar Institute of Anatomy and Biology, Philadelphia, Pennsylvania.

Stekol, Jakob A. et al., "Pathological Effects of Excessive Methionine in the Diet of Growing Rats", The Journal of Nutrition, May 1962, pp. 81-90, vol. 77, No. 1, The Wistar Institute of Anatomy and Biology, Philadelphia, Pennsylvania.

Walser, Mackenzie et al., "The Effect of Keto-analogues of Essential Amino Acids in Severe Chronic Uremia", The Journal of Clinical Investigation, Jan. 1973, pp. 678-690, vol. 52, No. 1, The American Society for Clinical Investigation, Inc., New York, New York.

WHO Expert Committee, The Use of Essential Drugs: Eighth report of the WHO Expert Committee (including the revised Model List of Essential Drugs), Dec. 1997, WHO Technical Report Series 882, World Health Organization, Geneva.

Wingard, John R., "Infectious and Noninfectious Systemic Consequences", National Cancer Institute Monographs—Consensus Development Conference on Oral Complications of Cancer Therapies: Diagnosis, Prevention, and Treatment, 1990, pp. 21-26, No. 9, U.S. Department of Health and Human Services, Bethesda, Maryland.

* cited by examiner

US 6,996,453 B2

SUBSTRATE PROCESSING APPARATUS AND METHOD OF PROCESSING SUBSTRATE WHILE CONTROLLING FOR CONTAMINATION IN SUBSTRATE TRANSFER MODULE

BACKGROUND OF THE INVENTION

1. Field of the Invention

The present invention relates to a substrate processing apparatus and to a method of transferring the substrate to a processing chamber of the apparatus. More particularly, the present invention relates to a substrate transfer module for transferring a substrate from a container to a substrate processing chamber.

2. Description of the Related Art

The manufacturing of semiconductor devices generally includes a photolithographic process in which a photoresist pattern is formed on a wafer, and a dry etching process in which the wafer is subsequently etched using the photoresist pattern as an etching mask. The dry etching process is performed in a processing, chamber under a high vacuum state. However, a considerable amount of time is required for creating the high vacuum state in the processing chamber, i.e., for reducing the pressure from atmospheric pressure to a high vacuum pressure. Therefore, a low-vacuum loadlock chamber is used as a buffer in a dry etching apparatus so that wafers may stand ready while the high vacuum pressure is being created in the process chamber, whereby the wafers may be processed efficiently.

FIG. 1 is a plan view of a conventional multi-chamber dry etching apparatus for wafers having a diameter of 200 mm. Referring to FIG. 1, the conventional dry etching apparatus includes low-vacuum loadlock chambers 14a and 14b, a transfer chamber 15, and high-vacuum processing chambers 18a, 18b and 18c.

A cassette 12 that accommodates about 25 wafers, that is, semiconductor substrates 20, is loaded into the loadlock chamber 14a. A low-vacuum state of about $10^{-3}$ Torr is maintained in the loadlock chamber 14a. Thereafter, the wafers 20 in the first loadlock chamber 14a are transferred one-by-one to respective processing chambers 18a, 18b and 18c using a robot 16 disposed in the transfer chamber 15. All of the processing chambers 18a, 18b and 18c are maintained at a high-vacuum state of about $10^{-6}$ Torr. The wafers 20 are also transferred by the robot 16 to the second loadlock chamber 14b after the dry etching process is completed within the processing chambers 18a, 18b and 18c. The wafer cassette 12 in the second loadlock chamber 14b removed from the dry etching apparatus once all of the etched wafers 20 are received in the cassette 12.

Meanwhile, larger wafers are now being used to improve the efficiency of the overall semiconductor device manufacturing process and to save manufacturing costs. In particular, semiconductor wafers having a diameter of 300 mm are now being used to manufacture semiconductor devices. Accordingly, the semiconductor manufacturing apparatus and processes have been developed in line with the increase in the size of the wafers being used.

For instance, wafers having a diameter of 300 mm are stored and transported within a wafer container such as a front opening unified pod (FOUP). The FOUP is has a relatively large volume. Therefore, when the FOUP is introduced into the low-vacuum loadlock chamber, a large amount of time is required to reduce the pressure in the loadlock chamber from atmospheric pressure to a low vacuum pressure. Likewise, a large amount of time is required to subsequently increase the pressure in the loadlock chamber from the low vacuum pressure to atmospheric pressure. Therefore, the efficiency of the dry etching process using this type of apparatus is relatively low.

More specifically, apparatus for processing 300 mm wafers include a separately formed substrate transferring module, such as an equipment front end module (EFEM). The FOUP is loaded on a load port of the substrate transferring module and the wafers are transferred one-by-one to the loadlock chamber via the substrate transferring module.

FIGS. 2 and 3 show a conventional multi-chamber dry etching apparatus for dry etching 300 mm wafers. Referring to FIG. 2, the conventional dry etching apparatus includes a substrate transferring module 50, low-vacuum loadlock chambers 60a and 60b and a substrate processing section 65. The substrate processing section 65 has a plurality of high-vacuum processing chambers 66a, 66b and 66c in which predetermined processes are carried out on the wafers 62, and a transfer chamber 63 through which the wafers 62 are transferred between the loadlock chambers 60a and 60b and the processing chambers 66a, 66b and 66c.

As shown in FIG. 3, the substrate transferring module 50 includes load ports 58a and 58b for supporting FOUPs, a filter unit 59 for filtering air from the outside, and a substrate transfer chamber 54 in which a substrate transferring robot 56 is installed. Referring to FIGS. 2 and 3, the FOUP 52 accommodates one lot of wafers, e.g., 25 wafers 62. The FOUP 52 is placed on the first load port 58a of the substrate transferring module 50. Then, a front door (not shown) of the FOUP 52 facing the substrate transfer chamber 54 is opened.

The filter unit 59 of the substrate transferring module 50 is a fan filter unit (FFU) in which a fan and a filter are combined. The filter unit 59 allows the clean air 80 from a clean room filter 75 to flow down into the substrate transferring chamber 54. Accordingly, the substrate transferring chamber 54 has the same temperature and atmospheric pressure (temperature of about 23° C., humidity of about 45%) as the clean air 80 flowing from the filter unit 59. Since the FOUP 52 is connected to the substrate transfer chamber 54 while the front door of the FOUP 52 is opened, the clean air 80 flows from the substrate transfer chamber 54 into the FOUP 52. Hence, the interior of the FOUP is at the same temperature (room) and pressure (atmospheric) as the air in the substrate transfer chamber 54.

A first one of the wafers 62 is loaded into the first loadlock chamber 60a in which a low-vacuum state of about $10^{-3}$ Torr is maintained, using the substrate transferring robot 56 disposed within the substrate transfer chamber 54. Then, the wafer 62 in the first loadlock chamber 60a is transferred to a respective one of the processing chambers 66a, 66b and 66c by the transferring robot 64 disposed within the transfer chamber 63. A high vacuum pressure of about $10^{-6}$ Torr is maintained in all the processing chambers 66a, 66b and 66c.

Once the first wafer 62 is dry etched, the wafer is transferred to the second loadlock chamber 60b using the transferring robot 64. After that, the first wafer 62 is transferred to a FOUP 52 disposed on the second load port 58b using the substrate transferring robot 56. The wafer remains there in the FOUP 52 for about 50 minutes until the remaining wafers are processed. When all of the other wafers are processed and received in the FOUP 52, the front door of the FOUP 52 is closed and the FOUP 52 is removed from the dry etching apparatus.

As described above, in the conventional dry etching apparatus for dry etching 200 mm wafers, a wafer cassette accommodating 25 wafers is directly loaded into the low-vacuum loadlock chamber so that the cassette is isolated from the external clean air. On the contrary, in the conventional dry etching apparatus for etching 300 mm wafers, the wafers are transferred to the first loadlock chamber 60a one-by-one from the FOUP 52 using the substrate transferring module 50. That is, the FOUP containing the wafers 62 remains on the second load port 58b of the substrate transferring module 50 while the front door of the FOUP 52 is opened and exposed to the clean air 80. Thus, the processing of the 300 mm wafers requires a great deal of time.

The characteristics of the conventional dry etching apparatus for etching 200 mm wafers and the conventional dry etching apparatus for etching 300 mm wafers are set out in the following Table 1.

time while at room temperature and under atmospheric pressure. The condensation phenomena also occur in the conventional dry etching apparatus for etching 200 mm wafers. However, those problems can be solved by managing the delay time after the wafers are tracked out from the dry etching apparatus up until the time the wafers are subjected to a subsequent cleaning process. In the conventional dry etching apparatus for etching 300 mm wafers, the first wafer experiences a delay time of about 50 minutes while the FOUP is connected to the substrate transfer module of the dry etching apparatus, i.e., a condensation phenomenon may occur before the wafer is tracked out.

A processing apparatus for dry etching 300 mm wafers, in which the FOUP is directly loaded into a low-vacuum

TABLE 1

| | 1 | 2 | 3 | 4 | 5 | 6 | 7 | 8 | 9 |
|---|---|---|---|---|---|---|---|---|---|
| 200 mm | clean room | Cassette in loadlock chamber | | transfer chamber | processing chamber | transfer chamber | cassette in loadlock chamber | | clean room |
| | | 25 wafers | | by 1 | by 1 | by 1 | 25 wafers | | |
| | 1 atm | $10^{-3}$ Torr | | $10^{-6}$ Torr | $10^{-6}$ Torr | $10^{-6}$ Torr | $10^{-3}$ Torr | | 1 atm |
| 300 mm | FOUP | EFEM | load-lock | transfer chamber | processing chamber | transfer chamber | loadlock | EFEM | FOUP |
| | 25 wafers | by 1 | By 1 | by 1 | by 1 | by 1 | by 1 | by 1 | 25 wafers |
| | 1 atm | 1 atm | $10^{-3}$ Torr | $10^{-6}$ Torr | $10^{-6}$ Torr | $10^{-6}$ Torr | $10^{-3}$ Torr | 1 atm | 1 atm |

As shown in Table 1, in the conventional dry etching apparatus for etching 300 mm wafers, the wafers are under room temperature and under an atmospheric pressure as they are transferred one-by-one between the loadlock chamber and a FOUP connected to the substrate transferring module (EFEM). Therefore, a great deal of time elapses while the etched wafers remain in the FOUP while the front door of the FOUP is open.

During this time, these wafers standing by in the FOUP are exposed to the clean air via the substrate transferring module. Accordingly, the wafers in the FOUP are exposed to various airborne molecular contamination (AMC) such as moisture ($H_2O$) and ozone ($O_3$) in the clean air. In this case, etching gas remaining on the surface of the wafer and the moisture in the air react, i.e., the etching gas condenses. The condensed etching gas forms minute particles that may bridge adjacent conductive patterns on the wafer.

FIG. 4 is a graph illustrating the number of particles of condensed etching gas that form over time on a wafer after the wafer is dry etched. The delay time (hours and minutes) in the graph is the amount of time a wafer is exposed to the ambient, e.g., the clean air. In the graph of FIG. 4, the delay time is the time that elapses from the completion of the dry etching of the wafer to the time the FOUP storing the wafer is transferred to the inspection apparatus. FIG. 4 shows that the number of particles on the wafer increases dramatically after a delay time of about 100 minutes. Therefore, such long delay times allow for the contamination of the wafer to intensify. Moreover, the contamination is particularly deleterious when the pattern on the wafer is minute, i.e., has a small critical dimension. For instance, particles of ozone can facilitate the growth of a natural oxide layer and thereby increasing the resistance of the pattern, and moisture can cause a gate oxide layer to deteriorate.

These 'condensation phenomena' are most severe for the first wafer which remains within the FOUP for the longest loadlock chamber, has been developed in an attempt to reduce the contamination of the FOUP and the wafers therein. However, the loadlock chamber of this apparatus must have a large volume to accommodate the relatively large FOUP. Hence, a great deal of time is required for forming a vacuum in the loadlock chamber of this apparatus. Accordingly, the efficiency of the apparatus is rather low. Therefore, the above-described apparatus in which the wafers within the FOUP are transferred to the loadlock chamber one-by-one via a substrate transferring module is generally used to process 300 mm wafers.

SUMMARY OF THE INVENTION

An object of the present invention is to solve the aforementioned problems of the prior art.

More specifically, an object of the present invention is to provide a substrate processing apparatus and method by which the level of contaminants within a substrate transferring module can be controlled.

Another object of the present invention is to prevent substrates from being contaminated while they are standing by in a container, such as a FOUP, as other substrates are being processed and subsequently loaded into the FOUP.

Yet another object of the present invention is to prevent substrates from being contaminated while they are being transferred in a closed container, such as a FOUP, after being dry etched or the like in a substrate processing apparatus.

In accordance with one aspect of the present invention, a substrate processing apparatus includes a container configured to support a plurality of substrates, a substrate processing part including at least one processing chamber in which a predetermined process is performed on the substrate, a substrate transferring module including a substrate transfer chamber through which substrates are transferred to the at least one processing chamber from the container, and a contamination controlling section for controlling the level of contaminants in the chamber of the substrate transfer chamber.

The substrate transfer module also includes a load port disposed outside the substrate transfer chamber and configured to support the container as exposed to the ambient outside the processing apparatus, and substrate transferring means for transferring the substrates from the container. The contamination controlling system includes a gas inlet port connected to the substrate transfer chamber and through which purging gas is supplied into the substrate transfer chamber, and a gas circulating tube extending outside the substrate transfer chamber and connected to respective portions of said substrate transfer chamber spaced from one another along a length of the chamber. Accordingly, the purging gas in the substrate transfer chamber can be circulated through the substrate transfer chamber using the gas circulating tube.

In accordance with another aspect of the present invention, a method of processing a substrate begins by providing purging gas into a substrate transfer chamber and circulating the purge gas through the chamber. Then, a container accommodating a plurality of substrates is loaded on a load port outside the substrate transfer chamber. The substrates in the container are transferred into the substrate transfer chamber using a robot disposed in the substrate transfer chamber. From there, the substrates are transferred to at least one processing chamber in which a predetermined process is performed on the substrates. The processed substrates are then transferred into a container. The purging gas is supplied into the substrate transfer chamber and is re-circulated through the chamber from the time the substrates are transferred into the chamber to the time the processed substrates are loaded in the container.

According to the present invention, a purging gas, such as nitrogen gas, is supplied to the substrate transfer chamber of the substrate transferring module for transferring substrates from a container to one or more substrate processing chambers. The purging gas is also re-circulated through the substrate transfer chamber to remove moisture and various airborne molecular contaminating materials (AMC) including ozone from the substrate transfer chamber. Therefore, the condensate can be prevented from forming on the processed wafers while they are standing by in a container as more processed wafers are being processed and loaded into the container.

Also, a container supported by the load port of the substrate transferring module can be filled with purging gas from the substrate transferring chamber during the loading of substrates into or the unloading of the substrates from the container. In either case, contaminating materials are thus prevented from flowing into the container. In particular, moisture and contaminating materials in the ambient can be prevented from flowing into the container during transferring of the container to another apparatus for performing the next process on the wafers.

BRIEF DESCRIPTION OF THE DRAWINGS

The above objects and advantages of the present invention will become readily apparent by reference to the following detailed description made in conjunction with the accompanying drawings wherein.

DETAILED DESCRIPTION OF THE PREFERRED EMBODIMENTS

Figure 1:
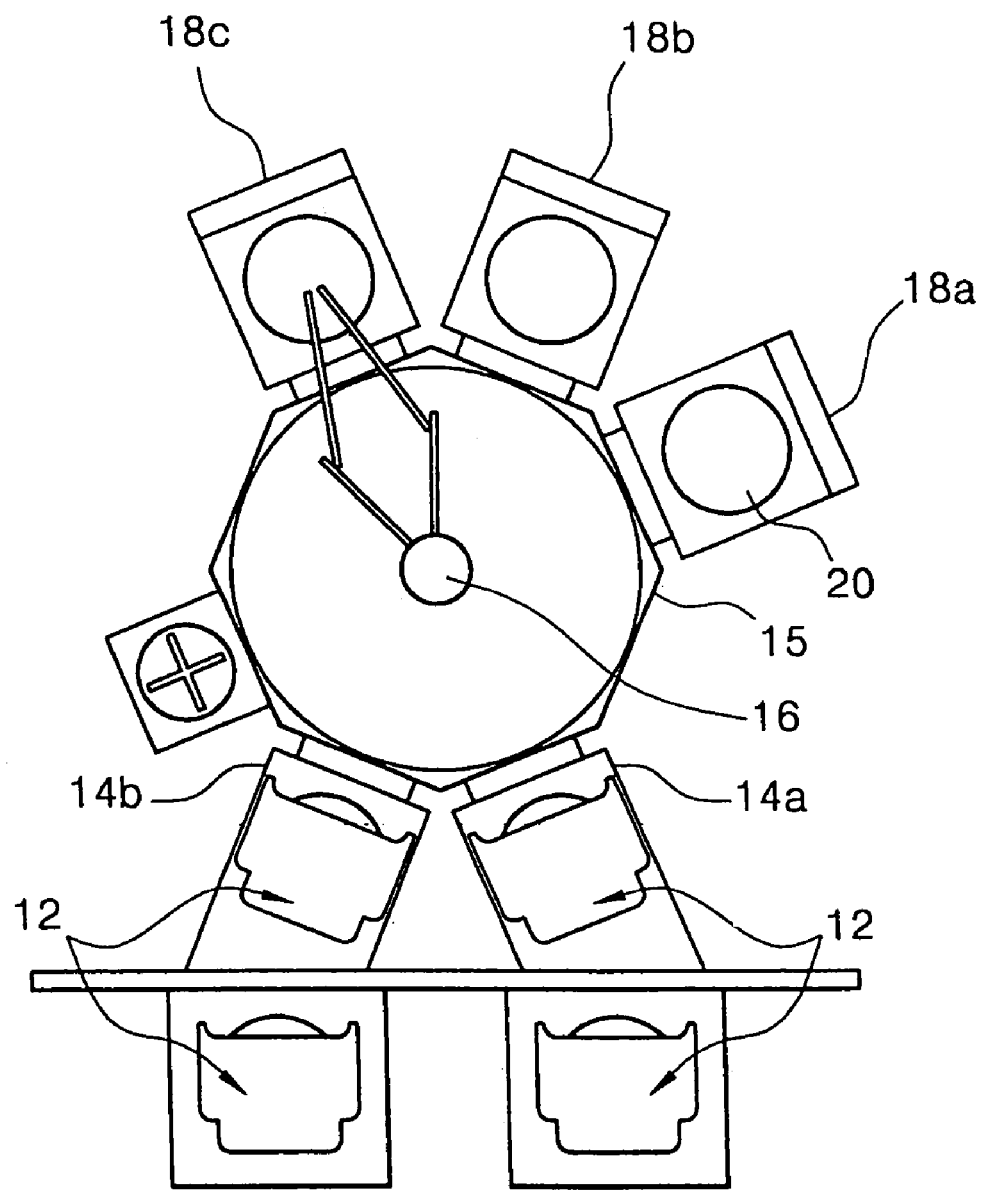
FIG. 1 is a plan view of a conventional dry etching apparatus for etching wafers having a diameter of 200 mm.
Figure 2:
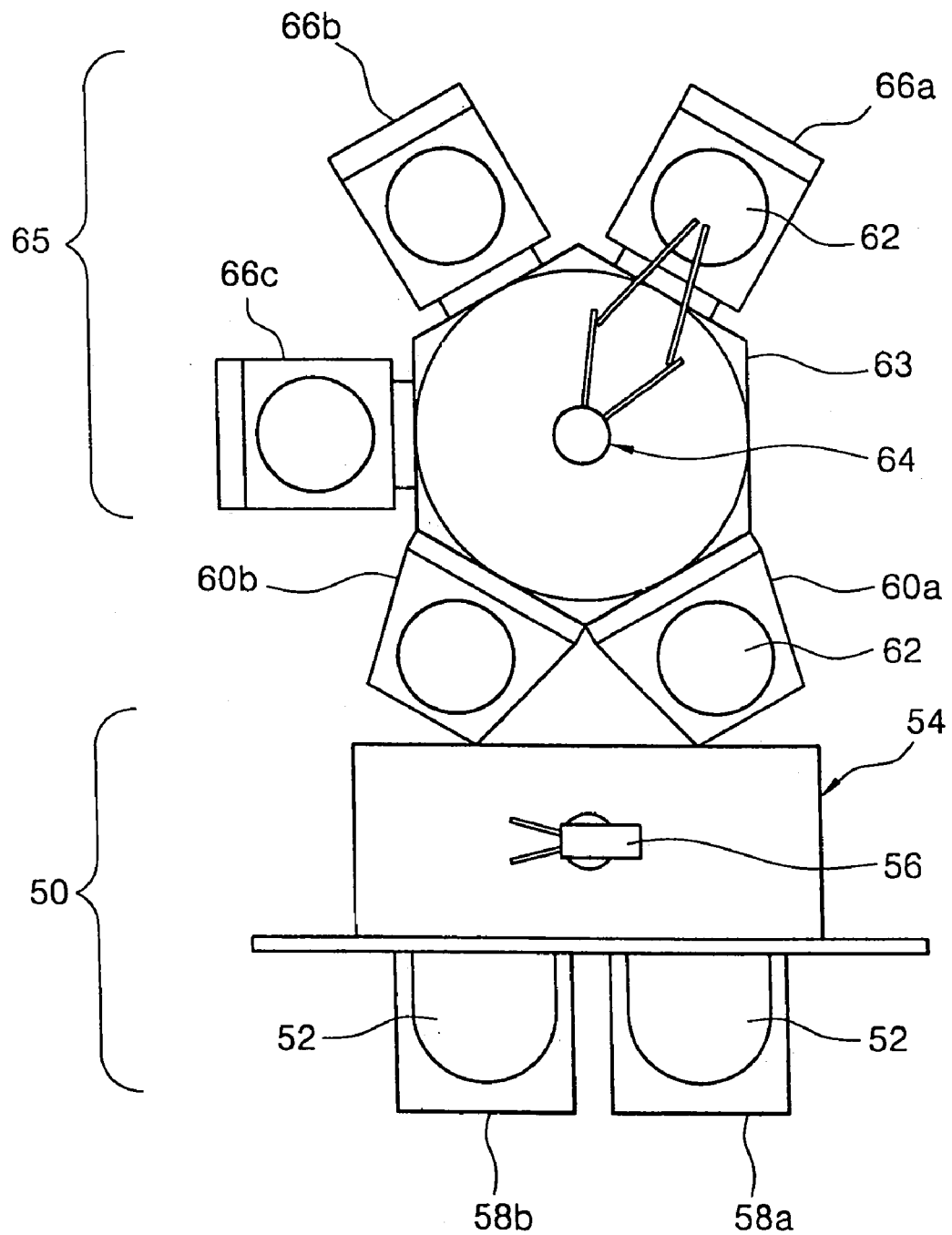
FIG. 2 is a plan view of a conventional dry etching apparatus for etching wafers having a diameter of 300 mm.
Figure 3:
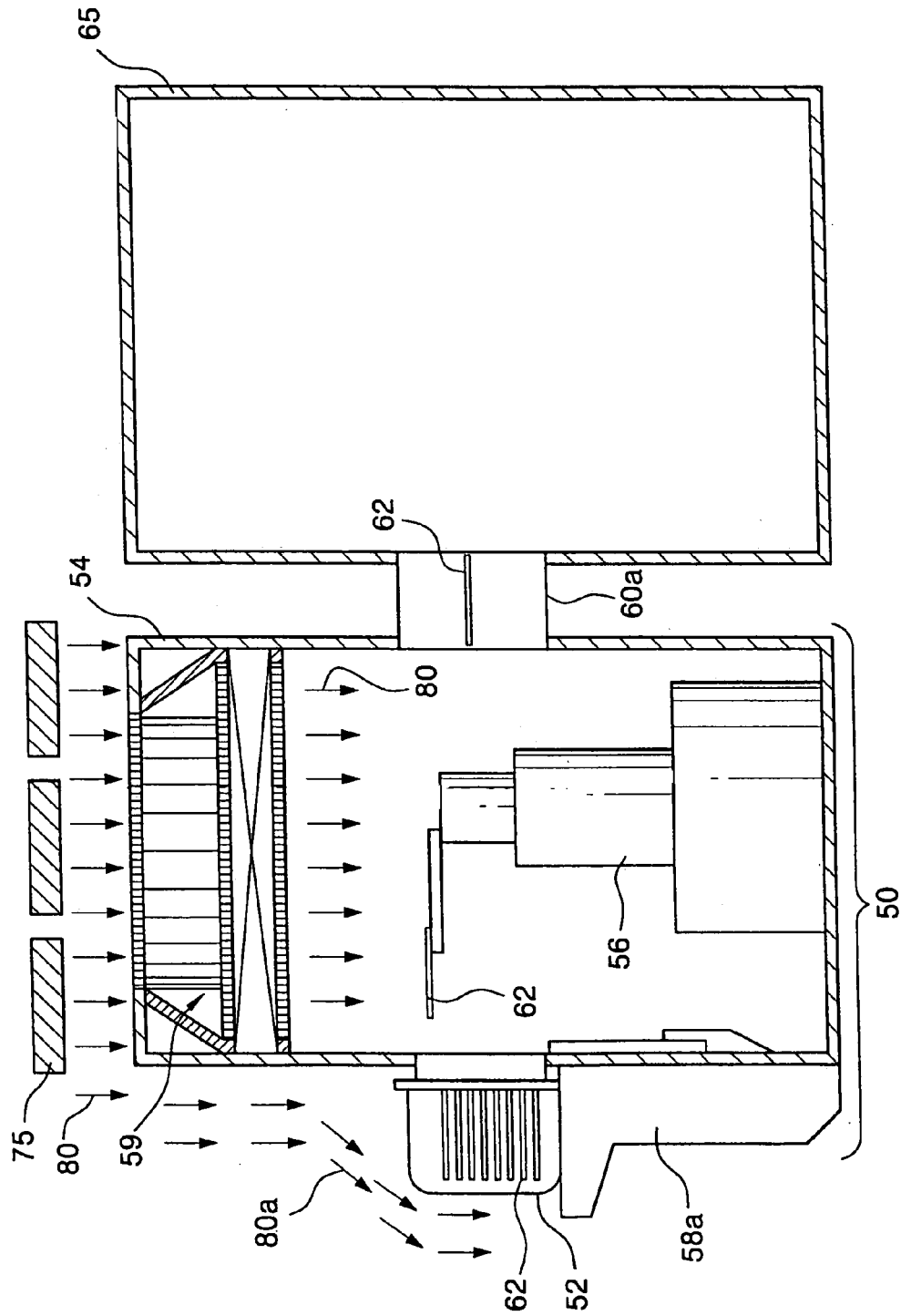
FIG. 3 is a side view of a substrate transfer module of the apparatus illustrated in FIG. 2.
Figure 4:
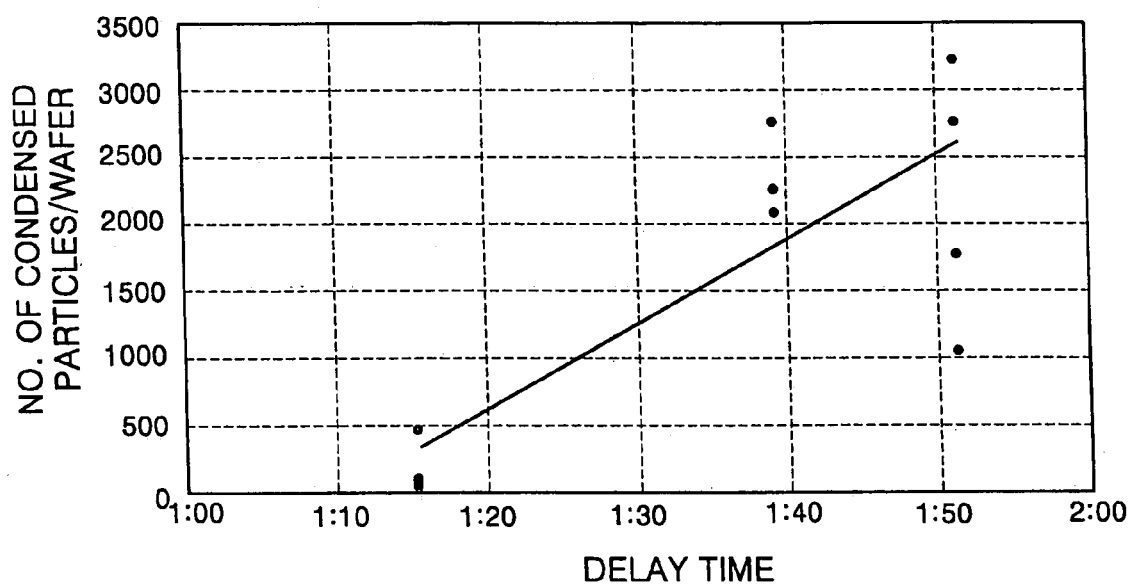
FIG. 4 is a graph illustrating the number of particles that form due to condensation over time on a substrate after the substrate has been dry etched and while the substrate is exposed.

Hereinafter, the preferred embodiments of the present invention will be described in detail with reference to the attached drawings. The same reference numeral designate like parts throughout the drawings.

Figure 5:
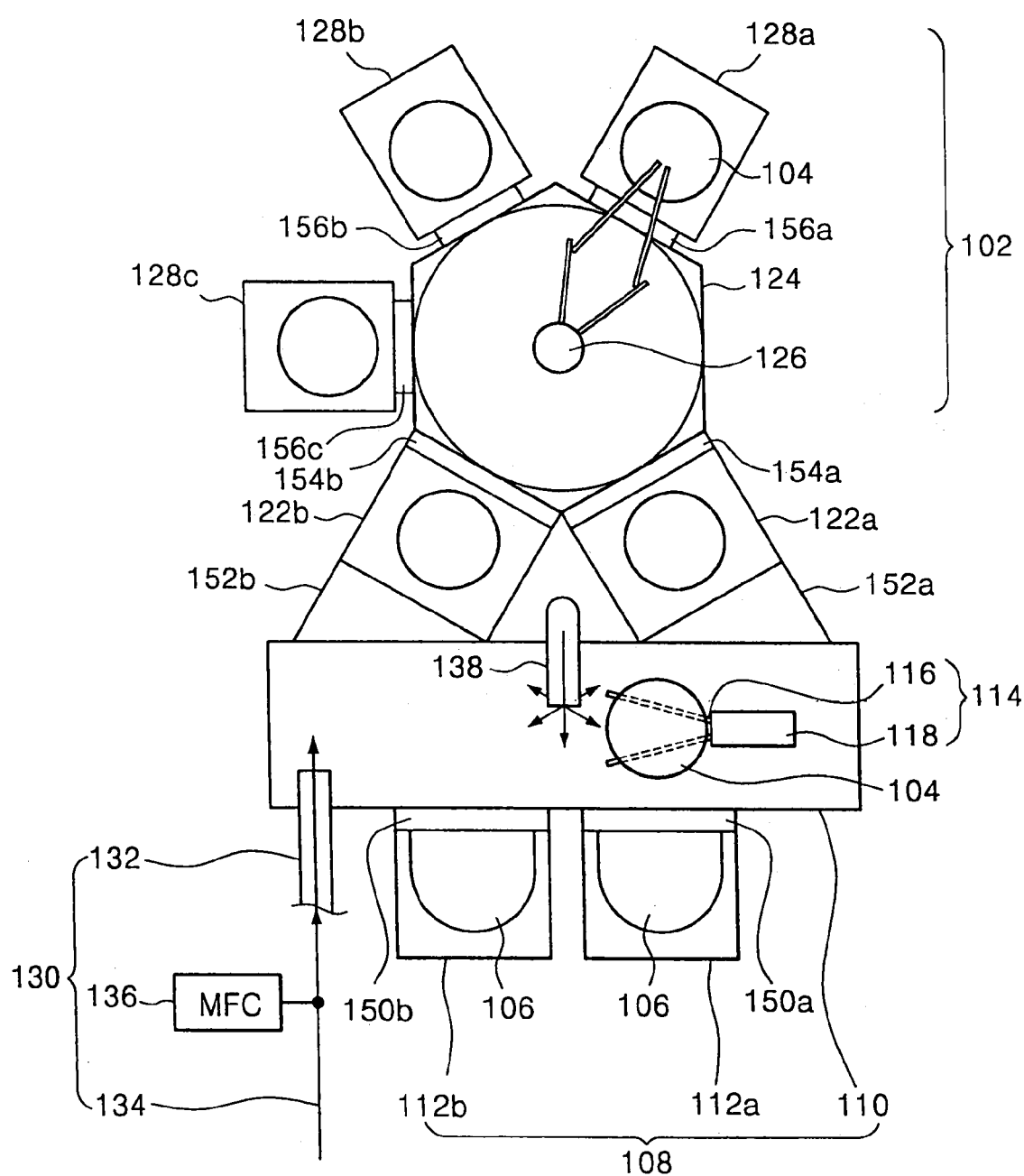
FIG. 5 is a plan view of one embodiment of a substrate processing apparatus according to the present invention.

Referring first to FIG. 5, a dry etching apparatus for etching 300 mm wafers includes a substrate transferring module 108, low-vacuum loadlock chambers 122a and 122b and a substrate processing section 102.

The substrate processing section 102 includes a plurality of high-vacuum processing chambers 128a, 128b and 128c, a transferring chamber 124, and a transferring robot 126 disposed in the transferring chamber 124. Wafers 104 having a diameter of 300 mm, for example, are transferred between the loadlock chambers 122a and 122b and the processing chambers 128a, 128b and 128c by the transferring robot 126. Predetermined processes, such as dry etching processes, are carried out on the wafers 104 in the processing chambers 128a, 128b and 128c.

Figure 6:
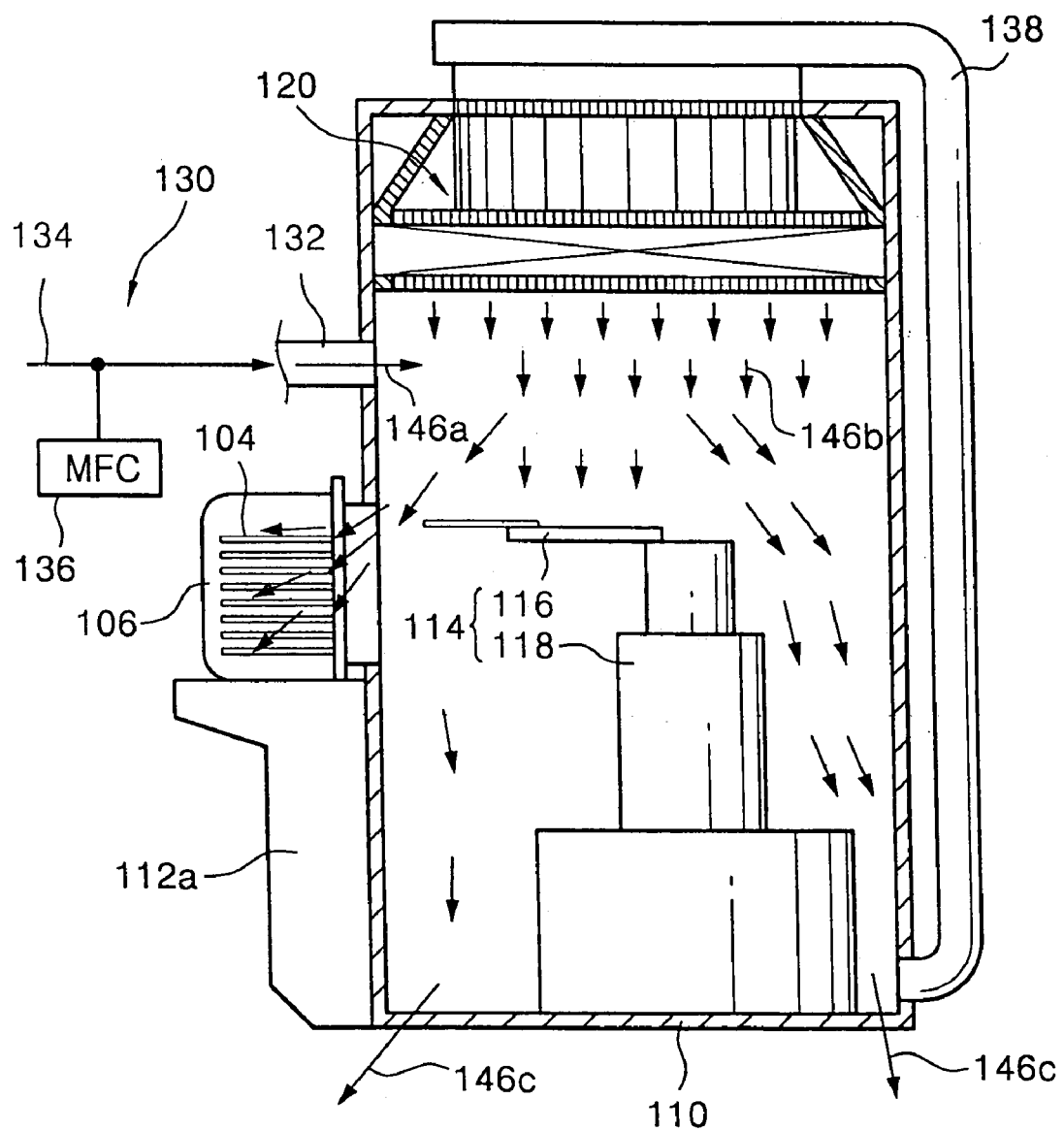
FIG. 6 is a side view of a substrate transfer module of the substrate processing apparatus illustrated in FIG. 5.

Referring now to both FIGS. 5 and 6, the substrate transferring module 108 includes a substrate transfer chamber 110, a substrate transferring apparatus 114 installed in the substrate transfer chamber 110, at least one load port 112a and 112b provided at the exterior of the substrate transferring chamber 110 for supporting a container 106 of wafers 104, and a filter unit 120 for introducing external air into the substrate transferring chamber 110.

Preferably, the container 106 is a FOUP and the substrate transferring apparatus 114 is a robot including a robot arm 116 for supporting the wafers 104 and an arm driving portion 118 for driving the robot arm 116 to transfer the wafers 104. The filter unit 120 is a fan filter unit (FFU) in which a fan and a filter are integrated with each other.

The substrate processing apparatus also includes a contamination controlling system 130 connected to an outer portion of the substrate transferring module 108. The contamination controlling system 130 includes a gas supply inlet 132 for providing the substrate transfer chamber 110 with purging gas 146a to purge the inside of the substrate transferring chamber 110, and a gas circulating tube 138 for circulating the purging gas through the substrate transfer chamber 110. The purging gas can be an inert gas or dry air (air from which humidity has been removed). Preferably, the purge gas is nitrogen ($N_2$). The contamination controlling system 130 also includes a gas line 134 connected to the gas supply inlet 132, and a mass flow controller (MFC) 136 for controlling the flow rate of the purge gas through the gas line 134 and to the gas supply inlet 132.

The gas circulating tube 138 is extends at one side of the substrate transfer chamber 110 between a lower portion and an uppermost portion of the substrate transfer chamber 110 such that the purging gas recycled back into the substrate transfer chamber 110 through the gas circulating tube 138 forms a laminar flow within the substrate transfer chamber 110. Also, the gas circulating tube 138 is connected to the fan filter unit 120 so that the purging gas is filtered before it is circulated back into the substrate transfer chamber 110.

Now, when the ambient within the substrate transfer chamber 110 is purged by the purging gas, the process would consume a large amount of purging gas and pose problems relating to the exhausting of the purging gas. Therefore, it is preferred that only a portion of the total volume of the ambient in the substrate transfer chamber 110 be purged utilizing the purging gas, and that the purging gas recycled back into the substrate transfer chamber 110 be exhausted through a natural leakage of the purging. In FIG. 6, reference numeral 146a designates the purging gas supplied to the substrate transferring chamber 110 through the gas supply inlet 132, reference numeral 146b designates the purging gas provided back into the substrate transfer chamber 110 through the gas circulating tube 138, and reference numeral 146c designates the purging gas that leaks out naturally from the substrate transferring chamber 110 due to its own pressure.

The operation of the above-described substrate processing apparatus will now be described in more detail.

First, clean air is introduced into the substrate transfer chamber 110 through the fan filter unit 120 before a predetermined process, such as a dry etching process, is carried out Therefore, the interior of the substrate transferring chamber 110 is maintained at the same temperature and humidity as the clean air outside the chamber 110, for example, at a temperature of about 23° C. and at a humidity of about 45%.

Next, the purging gas 146a, preferably nitrogen ($N_2$), is supplied into the substrate transfer chamber 110 through the gas supply inlet 132 to purge the substrate transfer chamber 110 of moisture or other potential contaminants. The purging gas within the substrate transferring chamber 110 is induced into the gas recycling tube 138 and from there is circulated back into the substrate transferring chamber 110 by the fan filter unit 120. The purging process carried out by the contamination controlling system 130 is continuously carried out until the predetermined processes, such as the dry etching of all of the wafers 104 are carried out and the final wafer is transferred into the FOUP 106.

During the purging process, a FOUP 106 containing one lot of wafers, that is, twenty-five wafers 104, is loaded on the first load port 112a of the substrate transferring module 108. Subsequently, the front door 150a of the FOUP 106 facing the substrate transfer chamber 110 of the substrate transferring module 108 is opened. A first one of the wafers 104 in the FOUP 106 is transferred to the substrate transfer chamber 110 by the substrate transferring apparatus 114 disposed within the substrate transfer chamber 110. Then, a gate valve 152a between the substrate transfer chamber 110 and the first loadlock chamber 122a is opened. The first wafer is loaded into the first loadlock chamber 122a, in which a low-vacuum state of about $10^{-3}$ Torr is maintained, by the substrate transferring apparatus.

The gate valve 152a between the substrate transfer chamber 110 and the first loadlock chamber 122a is then closed and a gate valve 154a between the transfer chamber 124 of the substrate processing section 102 and the first loadlock chamber 122a is opened. Then, the first wafer is transferred into the transfer chamber 124 by the transferring robot 126 disposed within the transfer chamber 124. Next, a gate valve 156a, 156b or 156c between the transfer chamber 124 and a respective processing chamber 128a, 128b and 128c is opened. Then, the first wafer is transferred to the respective processing chamber 128a, 128b and 128c by the transferring robot 126. At this time, the processing chambers 128a, 128b and 128c are maintained at a high-vacuum state of about $10^{-6}$ Torr.

The gate valve 156a, 156b or 156c is then closed, and the first wafer is subjected to a predetermined process, such as a dry etching process, within the processing chamber 128a, 128b or 128c.

The gate valve 156a, 156b or 156c between the transfer chamber 124 and the respective processing chamber 128a, 128b or 128c is opened after the first wafer is processed therein. The first wafer is then transferred into the transfer chamber 124 using the transferring robot 126.

The gate valve 156a, 156b or 156c between the transfer chamber 124 and the processing chambers 128a, 128b or 128c is closed. Then a gate valve 154b between the transfer chamber 124 and the second loadlock chamber 122b is opened. Then, the first wafer is transferred to the second loadlock chamber using the transferring robot 126.

Next, the gate valve 154b between the transfer chamber 124 and the second loadlock chamber 122a is closed, and the gate valve 152b between the substrate transfer chamber 110 and the second loadlock chamber 122b is opened. Then, the first wafer is transferred into the substrate transfer chamber 110 by the substrate transferring apparatus 114. Subsequently, the substrate transferring apparatus 114 transfers the first wafer from the substrate transfer chamber 110 into the FOUP 106 on the second load port 112b. The first wafer stands ready in the FOUP 106 for about 50 minutes until the remaining wafers are processed and transferred into the FOUP 106. However, the interior of the substrate transfer chamber 110 connected to the FOUP 106 is continuously purged by nitrogen gas during this time so that moisture and contaminants are removed from the substrate transfer chamber 110. Therefore, the purging process prevents the first wafer from absorbing humidity and other potential contaminants. The front door of the FOUP is closed and then no more purging gas is supplied into the substrate transferring chamber 110 once all the processed wafers are received in the FOUP 106. Then, the FOUP 106 is removed from the dry etching apparatus.

According to the present invention, as described above, the front doors 150a and 150b of the FOUPs 106 are opened while the FOUPs 106 are supported by the load ports 112a and 112b during the processing of the wafers 104. Therefore, the purging gas, such as nitrogen ($N_2$), supplied into the substrate transfer chamber 110 fills the FOUPs 106. Accordingly, the purging filling the FOUP 106 prevents an inflow of humidity and airborne molecular contaminating material (AMC) when the FOUP 106 is subsequently transferred to another apparatus. In the case of the FOUP containing the processed wafers, the wafers are prevented from absorbing humidity and airborne molecular contaminating material (AMC) prior to the next process.

Figure 7:
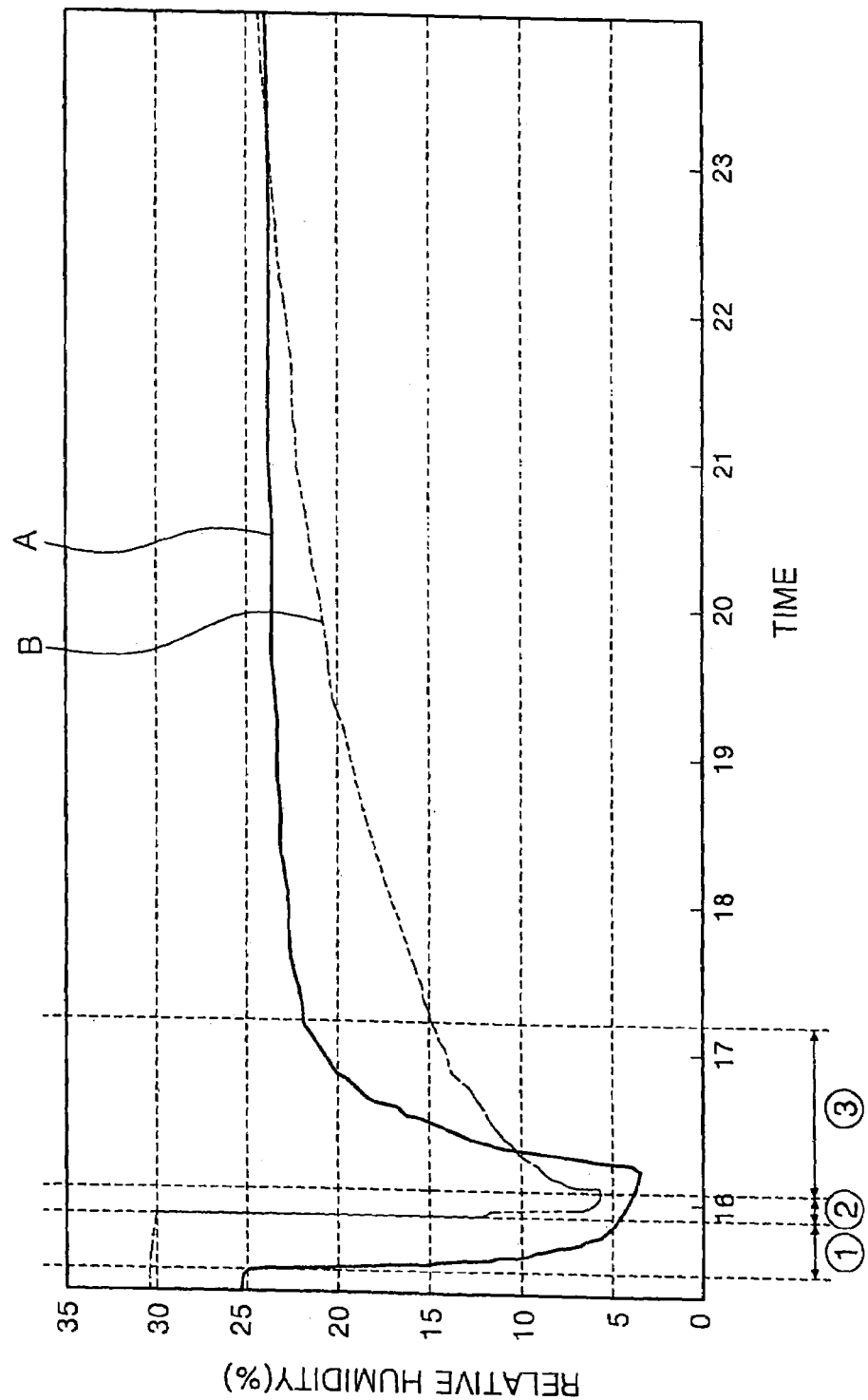
FIG. 7 is a graph illustrating the change of humidity within a substrate transfer chamber and a FOUP over time as the substrate transfer chamber is purged according to the present invention.

FIG. 7 is a graph illustrating a change in the humidity within the substrate transferring chamber and a FOUP as the substrate transfer chamber is purged by nitrogen gas. Region ① in the graph corresponds to the interval over which the purging gas is initially introduced into the substrate transferring chamber. Region ② corresponds to the interval during which FOUP is provided on a load port outside the substrate transfer chamber. Region ③ corresponds to the interval during which the FOUP is removed from the load port. Plot A indicates the relative humidity in the substrate transfer chamber and plot B indicates the relative humidity in the FOUP.

Referring to FIG. 7, the humidity in the substrate transfer chamber is reduced from about 25% to about 4% during the time the nitrogen ($N_2$) gas is supplied into the substrate transfer chamber. Also, the nitrogen gas fills the FOUP while the wafers are being processed during this time because the front door of the FOUP remains open. Accordingly, the humidity in the FOUP is decreased from about 30% to about 6%.

After the front door of the FOUP was closed and the FOUP was unloaded from the load port, the FOUP was placed in a clean room. Here, it took about one hour and ten minutes for the humidity within the FOUP to increase to about 50% of that of the humidity of the air in the clean room outside the FOUP. Accordingly, an inflow of humidity and airborne molecular contaminating material (AMC) into the FOUP can be prevented during the time the FOUP remains in a clean room between processes, i.e., between the time the door of the FOUP is closed and the FOUP is transferred to another apparatus.

Figure 8:
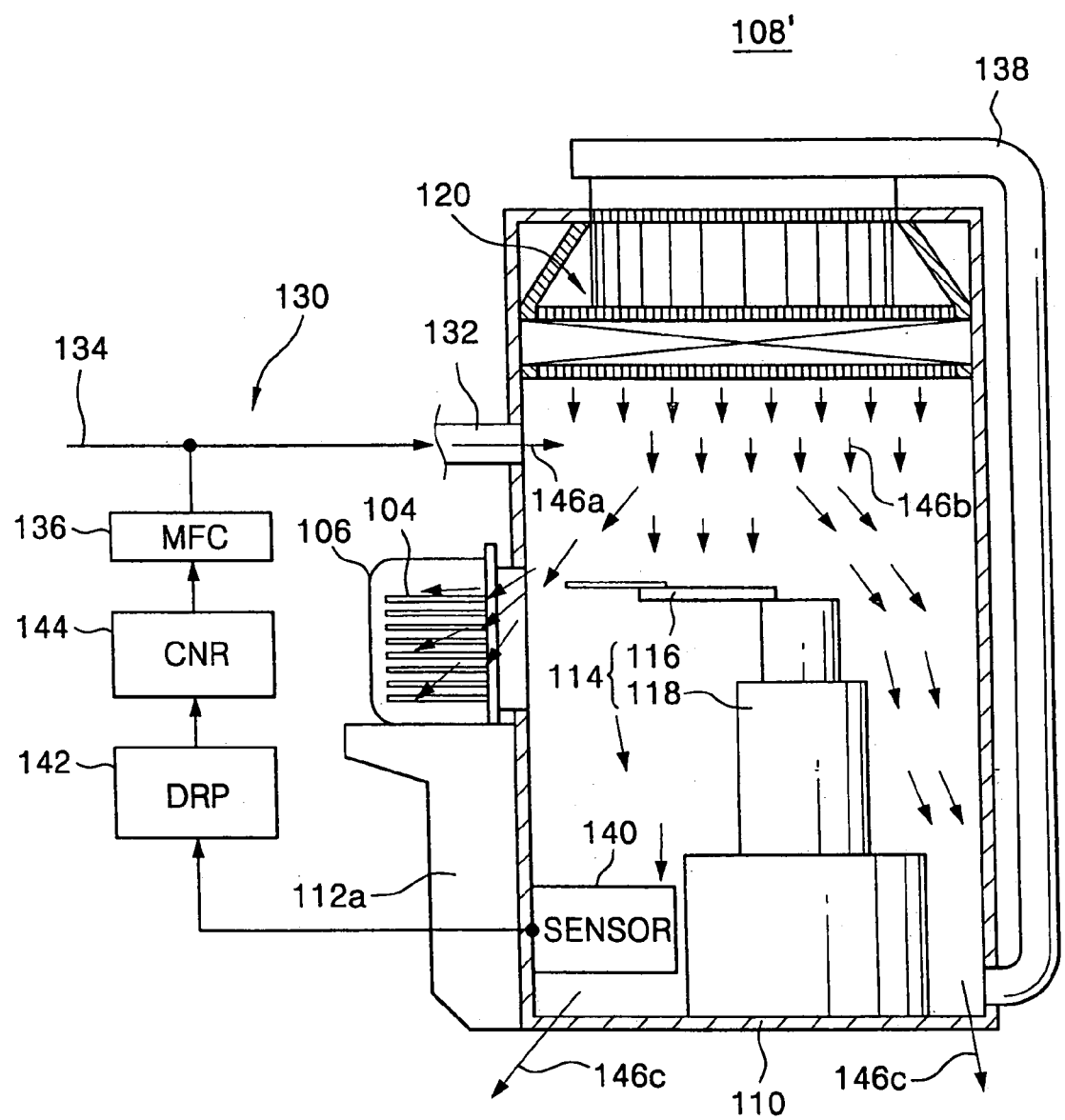
FIG. 8 is a side view of another embodiment of a substrate transfer module of a substrate processing apparatus according to the present invention.

FIG. 8 is a side view of a second embodiment of a substrate transferring module 108' of a substrate processing apparatus according to the present invention. The second embodiment of the substrate transferring module 108' is the same as that 108 of the first embodiment except for the contamination controlling system. Accordingly, only the contamination controlling system will be described for the sake of brevity.

As in the first embodiment, the contamination controlling system 130 includes a gas supply inlet 132 for providing purging gas 146a (an inert gas such as nitrogen ($N_2$) or a dried gas) into the substrate transfer chamber 110, a gas supply line 134, an MFC 136 associated with the gas supply line 134, and a gas circulating tube 138 for circulating the purging gas through the substrate transfer chamber 110.

However, the contamination controlling system 130 of this embodiment also includes a sensor 140 for detecting the temperature or humidity inside the substrate transfer chamber 110, a controller 144 (CNR) for controlling the MFC 136 to regulate the amount of purging gas 146a supplied into the substrate transfer chamber 110, and a data receiving portion 142 (DRP) for recording the temperature and humidity detected by the sensor 140 and transmitting this data to the controller 144 (CNR).

Once again, the moisture or other contaminating material in the substrate transferring chamber 110 is purged by supplying the purging gas 146a into the substrate transfer chamber 110 through the gas supply inlet 132 of the contamination controlling system 130. During this time, the purging gas in the substrate transferring chamber 110 is induced into the gas circulating tube 138 and is thus supplied back into the substrate transfer chamber 110.

In addition, the temperature and humidity in the substrate transfer chamber 110 is measured in real time by the sensor 140 while the purging gas 146a is supplied into the substrate transfer chamber 110. The measurements are transmitted to the controller 144 by the data receiving portion 142. The controller 144 then controls the operation of the MFC 136 based on the data received from the data receiving portion 142.

For example, an operator may set an allowable value of less than 1% for the humidity (a moisture concentration in a range of about 1000 to about 500 ppm). In this case, if the measured moisture concentration in the substrate transferring chamber 110 exceeds the allowable value, the controller 144 controls the MFC 136 so as to increase the amount of purging gas supplied into the substrate transferring chamber 110. On the contrary, the controller 144 controls the MFC 136 to decrease the amount of the purging gas being supplied into the substrate transferring chamber 110 when the measured moisture concentration is lower than the allowable value set by the operator.

As described above, according to the present invention, purging gas is supplied into and circulated throughout the substrate transfer chamber of a substrate transferring module for transferring substrates from a container to a substrate processing section in which the substrates are processed. Accordingly, the humidity and the amount of airborne molecular contaminating material (AMC) including ozone are controlled in the substrate transferring chamber. Therefore, the formation of particles by condensation on the wafers can be prevented while the wafers standby in the container after being processed.

In addition, the container supported on the load port of the substrate transferring module is filled with the purging gas. Accordingly, an inflow of moisture and external contaminating material into the container is prevented while the container is being transferred with the processed wafers to another apparatus. Therefore, the wafers are also prevented from being contaminated between processes.

Furthermore, the humidity in the substrate transfer chamber can be automatically controlled to a desired concentration by monitoring the temperature and humidity in the substrate transfer chamber in real time and by controlling the amount of purging gas supplied into the substrate transfer chamber. Accordingly, this further enhances the ability to prevent the wafers from being contaminated inside the container used to transfer the wafers.

Finally, although the preferred embodiments of the present invention have been described, it is understood that the present invention should not be limited to these preferred embodiments but various changes and modifications can be made by one skilled in the art within the true spirit and scope of the present invention as hereinafter claimed.

What is claimed is:

1. A method of processing a substrate comprising:
   (a) providing purging gas into a substrate transfer chamber, and re-circulating the purging gas through the substrate transfer chamber;
   (b) loading a container, containing a plurality of substrates, onto a load port disposed outside of the substrate transfer chamber;
   (c) transferring the substrates from the container on the load port into the substrate transfer chamber using a robot disposed within the substrate transfer chamber;
   (d) transferring the substrates from the substrate transfer chamber to at least one substrate processing chamber;
   (e) processing the substrates within said at least one substrate process chamber;
   (f) transferring the processed substrates from said at least one process chamber into a container disposed on the load port at a standby position at which the interior of the container is exposed to the interior of the substrate transfer chamber,
   wherein said providing of the purging gas into the substrate transfer chamber, and said re-circulating of the purging gas through the substrate transfer chamber of step (a) are continuously carried out during the steps of (b) to (f) such that the container into which the substrates are being transferred in step (f) is filled with the purging gas from the substrate transfer chamber at the time a substrate is first transferred into the container, whereby the substrates in the container are enveloped by the purging gas; and (g) measuring the humidity in the substrate transfer chamber in real time during the step of (a), determining a value for the level of humidity in the transfer chamber at which condensate will not form on a wafer accommodated within a container at said standby position, increasing the amount of the purging gas being supplied into the substrate transfer chamber when the measured humidity exceeds said value, and decreasing the amount of the purging gas being supplied into the substrate transfer chamber when the measured humidity is less than said value, whereby the formation of particles by condensation on substrates within said container at said standby position is prevented.

2. The method of processing a substrate as claimed in claim 1, wherein the step of (c) and the step of (d) comprise transferring the substrates one-by-one.

3. The method of processing a substrate as claimed in claim 2, further comprising:

(h) unloading the container into which the substrates are transferred once all of the substrates from the container disposed on the load port are processed and the step of (f) is carried out.

4. The method of processing a substrate as claimed in claim 3, wherein said providing of the purging gas into the substrate transfer chamber, and said re-circulating of the purging gas through the substrate transfer chamber of the step of (a) are continuously carried out during the steps of (b) to (h).

5. The method of processing a substrate as claimed in claim 1, wherein the purging gas includes an inert gas.

6. The method of processing a substrate as claimed in claim 5, wherein the inert gas includes nitrogen ($N_2$).

* * * * *